(12) United States Patent
Takahashi et al.

(10) Patent No.: US 10,707,047 B2
(45) Date of Patent: Jul. 7, 2020

(54) MEASURING DEVICE AND MEASURING METHOD

(71) Applicant: HITACHI HIGH-TECHNOLOGIES CORPORATION, Tokyo (JP)

(72) Inventors: Noritsugu Takahashi, Tokyo (JP); Makoto Sakakibara, Tokyo (JP); Wataru Mori, Tokyo (JP); Hajime Kawano, Tokyo (JP); Yuko Sasaki, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/325,662

(22) PCT Filed: Aug. 31, 2016

(86) PCT No.: PCT/JP2016/075413
§ 371 (c)(1),
(2) Date: Feb. 14, 2019

(87) PCT Pub. No.: WO2018/042531
PCT Pub. Date: Mar. 8, 2018

(65) Prior Publication Data
US 2019/0206654 A1 Jul. 4, 2019

(51) Int. Cl.
*H01J 37/20* (2006.01)
*H01J 37/12* (2006.01)
(Continued)

(52) U.S. Cl.
CPC .............. *H01J 37/12* (2013.01); *H01J 37/10* (2013.01); *H01J 37/141* (2013.01); *H01J 37/20* (2013.01); *H01J 37/21* (2013.01); *H01J 37/244* (2013.01)

(58) Field of Classification Search
CPC ........ H01J 37/21; H01J 37/304; H01J 37/317; H01J 37/3174; H01J 37/10; H01J 37/145; H01J 37/20; H01J 2237/21
See application file for complete search history.

(56) References Cited

U.S. PATENT DOCUMENTS 3,542,995 A * 11/1970 Cortland ................. H01J 37/21
219/121.26
6,188,071 B1 * 2/2001 Gordon ................. H01J 37/141
250/396 ML
(Continued)

FOREIGN PATENT DOCUMENTS

JP     2005-285746 A    10/2005
JP     2006-114599 A     4/2006
(Continued)

OTHER PUBLICATIONS

International Search Report dated Nov. 22, 2016 for the International Application No. PCT/JP2016/075413.
(Continued)

*Primary Examiner* — Wyatt A Stoffa
(74) *Attorney, Agent, or Firm* — Volpe and Koenig, P.C.

(57) ABSTRACT

A measuring device for measuring a sample by emitting a charged particle beam includes a particle source, an electronic lens, a detector, a stage, a sensor for measuring the environment, and a control device, in which the control device includes a control module having a height calculation module configured to calculate a height estimation value indicating an estimated height of the sample at a measurement position; and a correction value calculation module configured to calculate a correction value reflecting a change of the environment based on the measurement position of the sample and an amount of change of the environment measured by the sensor, and the control module corrects the height estimation value based on the correction value, and
(Continued)

sets a control value for controlling focus adjustment using the electronic lens based on the corrected height estimation value.

12 Claims, 10 Drawing Sheets

(51) Int. Cl.
    *H01J 37/21*     (2006.01)
    *H01J 37/244*     (2006.01)
    *H01J 37/10*     (2006.01)
    *H01J 37/141*     (2006.01)

(56) References Cited

U.S. PATENT DOCUMENTS

| | | | | |
|---|---|---|---|---|
| 8,384,052 | B2* | 2/2013 | Yamada | H01J 37/21 |
| | | | | 250/492.3 |
| 2003/0071231 | A1* | 4/2003 | Haraguchi | H01J 37/304 |
| | | | | 250/492.22 |
| 2005/0194533 | A1 | 9/2005 | Okuda et al. | |
| 2006/0076508 | A1* | 4/2006 | Nakasugi | B82Y 10/00 |
| | | | | 250/491.1 |
| 2007/0023689 | A1* | 2/2007 | Iizuka | B82Y 10/00 |
| | | | | 250/492.22 |
| 2008/0011965 | A1* | 1/2008 | Matsukawa | B82Y 10/00 |
| | | | | 250/398 |
| 2011/0057114 | A1* | 3/2011 | Yamada | H01J 37/3174 |
| | | | | 250/396 R |
| 2012/0119087 | A1 | 5/2012 | Takahashi et al. | |
| 2013/0134322 | A1* | 5/2013 | Yasuda | B82Y 10/00 |
| | | | | 250/396 ML |
| 2013/0284924 | A1* | 10/2013 | Mizuochi | G01N 23/2206 |
| | | | | 250/310 |
| 2014/0197313 | A1 | 7/2014 | Takahashi et al. | |
| 2015/0228455 | A1* | 8/2015 | Motosugi | H01J 37/3174 |
| | | | | 250/398 |
| 2017/0110285 | A1* | 4/2017 | Fukuda | H01J 37/28 |

FOREIGN PATENT DOCUMENTS

| | | |
|---|---|---|
| WO | 2009/136441 A1 | 11/2009 |
| WO | 2011/016182 A1 | 2/2011 |

OTHER PUBLICATIONS

Korean Office Action dated Nov. 29, 2019 for the Korean Patent Application No. 10-2018-7035700.

* cited by examiner

MEASURING DEVICE AND MEASURING METHOD

TECHNICAL FIELD

The present invention relates to a measuring device for inspecting a sample based on measurement of a fine circuit pattern or the like by using a charged particle beam.

BACKGROUND ART

As a charged particle beam device, which is the measuring device, a scanning electron microscope using an electron source as a charged particle source is widely known. A scanning electron microscope emits a primary charged particle beam (primary electron beam) accelerated from an electron source, focuses the primary charged particle beam by using an electronic lens, and scans a surface of a sample with the primary charged particle beam by using an electromagnetic deflector, thereby detecting a secondary signal generated from the sample, and imaging the detected secondary signal.

In a scanning electron microscope, since a primary electron beam is focused to a small region, a fine pattern of a sample can be observed. For this reason, a scanning electron microscope is applied to a measuring device for a scanning electron semiconductor used for measuring dimension of a fine circuit pattern in a scanning electron semiconductor manufacturing process.

A measuring device for a scanning electron semiconductor used for inspecting the operation state of a scanning electron semiconductor manufacturing process repeatedly performs a series of operations for moving a sample in X and Y directions and, after the movement of the sample to the measurement position is completed, correcting a focus deviated by a height change in a Z direction, specifying a measurement point, acquiring a magnified image of the specified measurement point, and measuring the dimension of the sample.

Increasing the number of measurement points is effective for improving measurement accuracy of the measuring device for a scanning electron semiconductor. However, a high throughput is required to achieve high measurement accuracy. In embodiments of the present invention, a throughput represents an inspection speed (inspection time), such as the number of measured samples.

As methods of improving a throughput, the techniques disclosed in PTL 1 and PTL 2 is known. PTL 1 discloses a device having functions of, before performing a measurement on a sample, creating a focus map indicating positions of the sample in the Z direction (heights of a sample) for each position thereof on the XY plane and estimating a focus condition of a measurement position based on the focus map. Furthermore, PTL 2 discloses a device having a function of correcting positional fluctuation of a sample in the in-plane direction (XY direction) according to environmental changes.

CITATION LIST

Patent Literature

PTL 1: JP-A-2005-285746
PTL 2: JP-A-2006-114599

SUMMARY OF INVENTION

Technical Problem

There are two known techniques for setting a focus, including a technique for setting a focus using an electromagnetic lens and a technique for setting a focus using an electrostatic lens. In the former technique for setting a focus, a focus is set by using an electromagnetic lens that changes the focusing action of a primary electron beam through the action of a magnetic field. In the latter technique for setting a focus, a focus is set by using an electrostatic lens that changes the focusing action of a primary electron beam through the action of an electric field.

In the case of the technique for setting a focus using an electromagnetic lens, although the focusing action of a primary electron beam can be significantly changed, the relationship between a coil current and the strength of a magnetic field is reproduced due to the magnetic hysteresis phenomenon of a magnetic body, and thus it takes time to set a focus.

On the other hand, in the case of the technique for setting a focus by using an electrostatic lens, since there is no hysteresis phenomenon, voltages applied to electrodes and focused positions are well reproduced, and thus a focus can be set at a high speed. However, when the focusing action of a primary electron beam is significantly changed, the aberration occurring on a lens increases.

Due to the above-mentioned characteristics, when the change of a focus condition (focus value) is small, a focus is set based on the technique for setting a focus using an electrostatic lens. On the other hand, when the change of a focus condition (focus value) is large, a focus is set based on the technique for setting a focus using an electromagnetic lens.

A focus map varies over time due to changes in the surrounding environment of a scanning electron microscope. Therefore, according to a conventional estimation method, the estimation accuracy of a position (height) of a sample in the Z direction using a focus map is low. Therefore, in both the technique for setting a focus using an electromagnetic lens and the technique for setting a focus using an electrostatic lens, it takes time to set the focus.

In the case of the technique disclosed in PTL 1, improvement of a throughput is limited, because it is necessary to create a focus map for each sample from the beginning in order to realize a focus map with measurable accuracy. Moreover, in PTL 1, fluctuation of a focus map due to environmental changes is not assumed, and thus, when an environment changes, an error of the focus map increases. In PTL 2, fluctuation of a sample in the Z direction due to environmental changes is not assumed.

The present invention provides a measuring device (charged particle beam device) capable of estimating the position of a sample in the Z direction at a measurement position with high accuracy when an environment changes.

Solution to Problem

A representative embodiment of the present invention disclosed in the present application is as follows. That is, an measuring device for measuring a sample by emitting a charged particle beam includes a particle source configured to emit the charged particle beam, a lens configured to focus the charged particle beam, a detector configured to detect a signal generated from the sample irradiated with the charged particle beam, a stage capable of moving with the sample mounted thereon, a sensor configured to measure environment of the measuring device, and a control device configured to control the measuring device overall, in which the control device includes a control module having a height calculation module configured to calculate a height estimation value indicating an estimated height of the sample at a measurement position and a correction value calculation module configured to calculate a correction value reflecting a change of the environment based on the measurement position of the sample and an amount of change of the environment measured by the sensor, and the control module corrects the height estimation value based on the correction value and sets a control value for controlling focus adjustment using the lens based on the corrected height estimation value.

Advantageous Effects of Invention

According to the present invention, even when an environment changes, since the height of a sample can be predicted without decreasing accuracy, a measuring device (charged particle beam device) with both a sufficient throughput and sufficient measurement accuracy can be provided. The problems, constructions, and effects other than those mentioned above will be clarified by the description of the following embodiments.

DESCRIPTION OF EMBODIMENTS

Although not stated above as the problem to be solved by the invention, when a material constituting an electrostatic chuck or the like to be fixed by adsorbing a sample is different from a material constituting a stage to place the sample thereon, the change of the sample becomes more significant in the Z direction. Since materials with different characteristics have different expanding and contracting behaviors caused by environmental changes, a force is applied in the vertical direction to a bonding surface at which the different members are bonded to each other, and thus a deformation occurs.

In the present invention, a charged particle beam device having an electrostatic chuck and a sample stage composed of different materials is equipped with sensors for monitoring environmental changes. The charged particle beam device calculates an estimated value of the height of a sample at a measurement position using a focus map and also calculates a correction value based on the coordinates (the position in the XY plane) of the sample at the measurement position and an amount of an environmental change. The charged particle beam device corrects the estimated value of the height of the sample based on the correction value. The charged particle beam device sets a control value for setting a focus based on the estimated value.

Embodiments of the present invention will be described below with reference to the accompanying drawings. In the drawings, the same reference numerals denote the same elements.

First Embodiment

Figure 1:
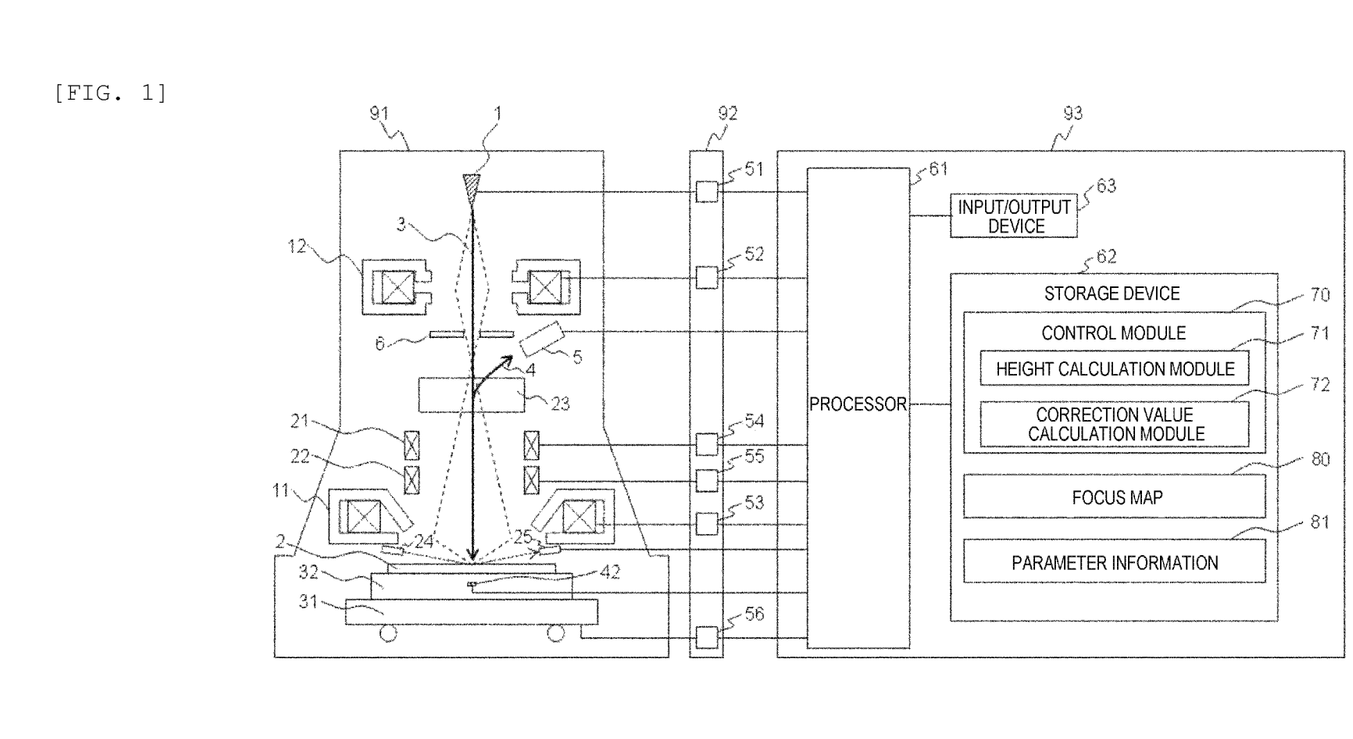
FIG. 1 is a diagram showing a configuration example of a charged particle beam device according to a first embodiment.

FIG. 1 is a diagram showing a configuration example of a charged particle beam device according to a first embodiment. In the first embodiment, a scanning electron microscope, which is one form of a charged particle beam device, will be described as an example.

The scanning electron microscope (measuring device) includes an electron optical system lens barrel 91, a power supply unit 92, and a control unit 93.

The power supply unit 92 supplies a voltage and a current to each component of the electron optical system lens barrel 91. The power supply unit 92 includes control power supplies 51, 52, 53, 54, 55, and 56 corresponding to respective components of the electron optical system lens barrel 91. A control power supply 51 is a control power supply configured to control a voltage applied to an electron source 1. Control power supplies 52, 53, 54, 55, and 56 are control power supplies configured to control currents applied to a condenser lens 12, an objective lens 11, coils of an upper stage scanning deflector 21 and a lower stage scanning deflector 22, and a drive motor of a sample stage 31, respectively.

The control unit 93 controls the entire scanning electron microscope. The control unit 93 includes a processor 61, a storage device 62, and an input/output device 63. Also, the control unit 93 may include a storage medium, such as a hard disk drive (HDD) and a solid state drive (SSD).

The processor 61 executes a predetermined calculation process according to a program stored in the storage device 62. For example, a central processing unit (CPU), a graphics processing unit (GPU), and the like may be employed as the processor 61.

The storage device 62 stores a program to be executed by the processor 61 and data to be used by the program. The storage device 62 includes a temporary storage area, such as a work area used by a program. The storage device 62 may be, for example, a memory or the like. Programs and data stored in the storage device 62 will be described later.

The input/output device 63 is a device configured to input and output data. The input/output device 63 includes a keyboard, a mouse, a touch panel, a display, and the like.

The electron optical system lens barrel 91 includes the electron source 1, a detector 5, a current limiting diaphragm 6, the objective lens 11, the condenser lens 12, a two-stage scanning deflector including the upper stage scanning deflector 21 and the lower stage scanning deflector 22, an ExB deflector 23, the sample stage 31, and an electrostatic chuck 32 mounted on the sample stage 31. On the sample stage 31, a sample 2 to be observed is placed. In the present embodiment, a temperature sensor 42 is mounted on the electrostatic chuck 32.

The electron optical system lens barrel 91 emits a primary electron beam 3 from the electron source 1. The primary electron beam 3 is focused by sequentially passing through the condenser lens 12 and the objective lens 11. That is, the focus of the primary electron beam 3 is adjusted. Further, the trajectory of the focused primary electron beam 3 is deflected using a two-stage scanning deflector including the upper stage scanning deflector 21 and the lower stage scanning deflector 22, and the deflected primary electron beam 3 2-dimensionally scans the sample 2. A secondary signal 4, such as secondary electrons or reflected electrons emitted from the sample 2 irradiated with the primary electron beam 3, is deflected by the ExB deflector 23 so as not to act on the primary electron beam 3 and is detected by the detector 5. The secondary signal 4 detected by the detector 5 is processed by the processor 61. A 2-dimensional image corresponding to the irradiation point of the primary electron beam 3 is displayed on the input/output device 63.

When changing the measurement position of the sample 2, the sample 2 is moved by using the sample stage 31 installed under the electrostatic chuck 32 that fixes the sample 2 by adsorbing the sample 2. After the sample 2 is moved, the electron optical system lens barrel 91 emits light in a diagonal direction from a light source 24 to the sample 2, and the height sensor 25 detects the reflected light of the light, thereby measuring the height of the sample 2.

The storage device 62 stores a program for activating the control module 70. In addition, the storage device 62 stores the focus map 80 and the parameter information 81. Furthermore, the storage device 62 retains programs and information those are not shown. For example, the storage device 62 stores position information indicating the position of a measurement point (measurement position), such as a defect position, of the sample 2.

The control module 70 controls each component of the electron optical system lens barrel 91. The control module 70 includes a height calculation module 71 and a correction value calculation module 72.

The focus map 80 is information obtained by estimating the height distribution of the sample 2 and includes data indicating a relationship between the coordinates of the sample 2 in the XY plane and the heights. For example, the focus map 80 includes data including the coordinates in the XY plane and heights of the sample 2. Also, a "height of sample 2" is synonymous with a "focus value". The parameter information 81 is information used when the correction value calculation module 72 calculates a correction value reflecting environmental changes.

The focus map 80 is created, for example, by measuring a bare wafer without a film formed thereon. In this case, the focus map 80 represents the shape of the sample 2 set by the shape of the electrostatic chuck 32 and the adsorbing force of the electrostatic chuck 32 to the sample 2. In general, the adsorbing force of the electrostatic chuck 32 is constant regardless of the type of sample 2. However, when the adsorbing force is changeable, the focus map 80 may be created for each adsorption condition.

Note that the sample 2 for an actual measurement is often a film-formed wafer. In the case of a film-formed wafer, the wafer may be distorted by stress generated between the wafer and a film formed on the wafer. In this case, it is easy to reflect a difference in the height distribution reflected by adsorption of the electrostatic chuck 32 for each process regarding the wafer as data, and reflecting the data can be taken into consideration.

Since a method of creating the focus map 80 is known in the art, a detailed description thereof will be omitted.

Figure 2:
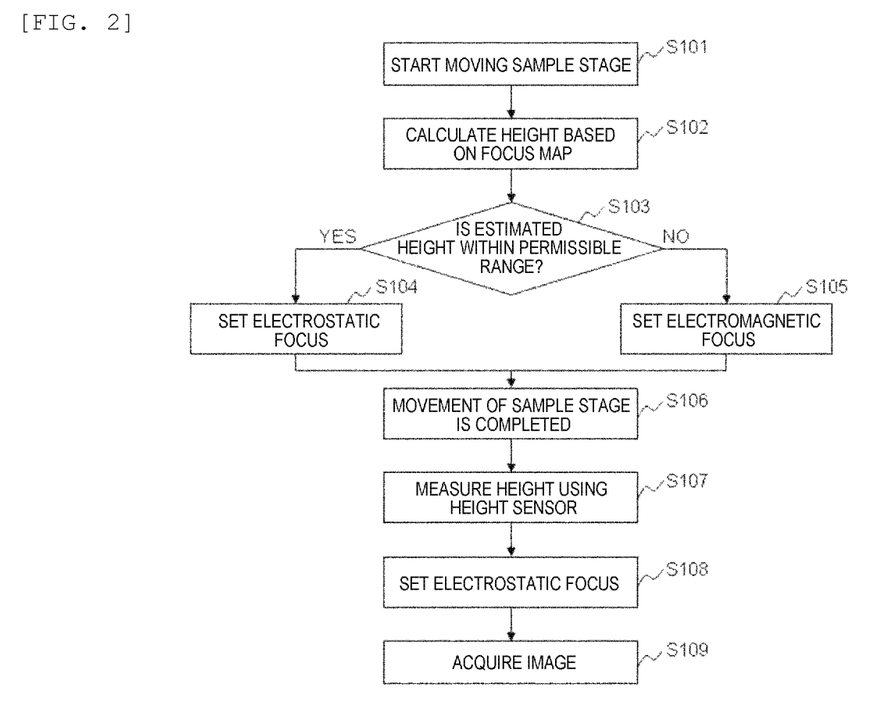
FIG. 2 is a flowchart illustrating an image acquisition process executed by a control unit according to the first embodiment by controlling an electron optical system lens barrel.

FIG. 2 is a flowchart illustrating an image acquisition process executed by the control unit 93 according to the first embodiment by controlling the electron optical system lens barrel 91.

The control module 70 instructs the electron optical system lens barrel 91 to start to move the sample 2 to the measurement position (step S101). The coordinates (the position in the XY plane) of the sample 2 at the measurement position are set in advance as position information. Upon reception of an instruction, the electron optical system lens barrel 91 starts to move the sample stage 31.

Next, the control module 70 executes a height calculation process based on the focus map 80 (step S102). In this process, an estimated value of the height at the measurement position of the sample 2 is calculated. The height calculation process based on the focus map 80 will be described below with reference to FIG. 3. In the following description, an estimated value of the height of the sample 2 at the measurement position will also be referred to as a height estimation value.

Next, the control module 70 determines whether a calculated height estimation value is within a permissible range (step S103).

Specifically, it is determined whether the calculated height estimation value is smaller than a predetermined threshold value. When the calculated height estimation value is smaller than the predetermined threshold value, the control module 70 determines that the calculated height estimation value is within the permissible range. It is assumed that the threshold value is preset in the storage device 62. The threshold value can be suitably updated as needed.

If it is determined that the calculated height estimation value is within the permissible range, the control module 70 executes a process for setting an electrostatic focus (step S104). Thereafter, the control module 70 proceeds to step S106.

In the process for setting the electrostatic focus, the control module 70 calculates a difference between the height of the position of sample 2 before the start of the movement of the sample 2 and the calculated height estimation value as a focus change amount and sets a control value for performing a focus adjustment using an electrostatic lens based on the focus change amount. Since a method of calculating a control value from the height (focus value) of the sample 2 is known in the art, detailed description thereof will be omitted.

When it is determined that the calculated height estimation value is not within the permissible range, the control module 70 executes a process for setting an electromagnetic focus (step S105). Thereafter, the control module 70 proceeds to step S106.

In the process for setting the electromagnetic focus, the control module 70 calculates a difference between the height of the position of sample 2 before the start of the movement of the sample 2 and the calculated height estimation value as a focus change amount and sets a control value for performing a focus adjustment using an electromagnetic lens based on the focus change amount. At this time, the control module 70 executes a lens reset process in order to avoid deterioration of reproducibility due to a magnetic hysteresis phenomenon of a magnetic material constituting the objective lens 11.

In step S106, when the movement of the sample stage 31 and the completion of a focus setting process are detected, the control module 70 shifts to the state in which the movement of the sample stage 31 is completed (step S106) and executes a height measurement process using the height sensor 25 (step S107).

Specifically, the control module 70 instructs the electron optical system lens barrel 91 to measure the height of the sample 2. When an instruction is received from the control module 70, the electron optical system lens barrel 91 emits light to the sample 2 by using the light source 24 and the reflected light is measured by the height sensor 25. A result of the measurement is input to the processor 61.

Next, the control module 70 executes a process for setting an electrostatic focus (step S108).

In the process for setting the electrostatic focus, the control module 70 calculates a difference between a height estimation value and the height calculated in step S107 as a focus change amount and sets a control value for performing a focus adjustment using an electrostatic lens based on the focus change amount.

Next, the control module 70 executes an image acquisition process (step S109).

Specifically, the control module 70 instructs the electron optical system lens barrel 91 to acquire an image. When an instruction is received from the control module 70, the electron optical system lens barrel 91 acquires the secondary signal 4 by irradiating the sample 2 with the primary electron beam 3 based on various setting values set by the control module 70. The acquired secondary signal 4 is input to the processor 61. The control module 70 generates image data from the secondary signal 4.

Figure 3:
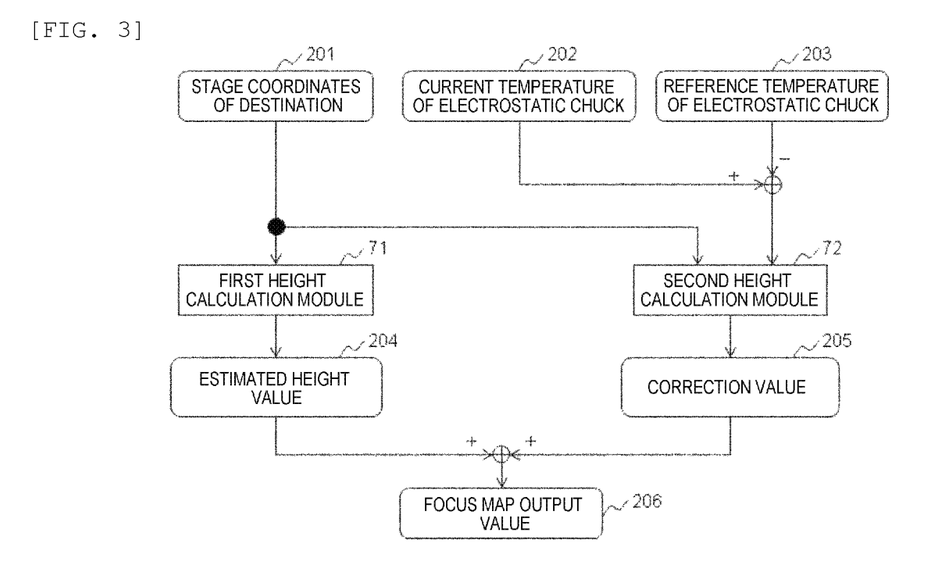
FIG. 3 is a diagram for describing details of a height calculation process based on a focus map according to the first embodiment.

FIG. 3 is a diagram for describing details of a height calculation process based on the focus map 80 according to the first embodiment.

The control module 70 acquires data 201 indicating stage coordinates of a destination (measurement position of the sample 2) from position information and inputs the data 201 to the height calculation module 71 and the correction value calculation module 72.

In addition, the control module 70 acquires data 203 representing a reference temperature of an electrostatic chuck and data 202 representing a current temperature of the electrostatic chuck and calculates a difference between the two temperatures. The control module 70 inputs the difference into the correction value calculation module 72.

The reference temperature of the electrostatic chuck 32 is a temperature of the electrostatic chuck 32 when a scanning electron microscope is adjusted or when the sample 2 is set on the sample stage 31, and is stored in the storage device 62 in advance. The current temperature of the electrostatic chuck 32 is a temperature measured by using the temperature sensor 42. In the present embodiment, it is assumed that the control module 70 acquires the data 202 when moving the sample stage 31.

Also, the control module 70 may calculate the current temperature of the electrostatic chuck 32 based on a difference between a temperature of the electrostatic chuck 32 before the sample 2 is set to the electrostatic chuck 32 and a temperature of the electrostatic chuck 32 after the lapse of a certain time after the sample 2 is set to the electrostatic chuck 32. Therefore, a period of time for acquiring the data 202 can be reduced.

When the data 201 is input, the height calculation module 71 calculates data 204 representing a height estimation value, based on the focus map 80 and the data 201. Since a method of calculating an estimated value of the height is known in the art, detailed description thereof will be omitted.

When the data 201 and a difference between the data 202 and the data 203 is input, the correction value calculation module 72 calculates data 205 indicating a change amount (correction value) of the height of the sample 2 associated with a temperature change based on the data 201 and the difference.

The control module 70 adds the correction value (the data 205) to the height estimation value (the data 204) and outputs a result thereof as a focus map output value 206. That is, the focus map output value 206 becomes a final height estimation value.

Next, the details of a process executed by the correction value calculation module 72 will be described.

Figure 4:
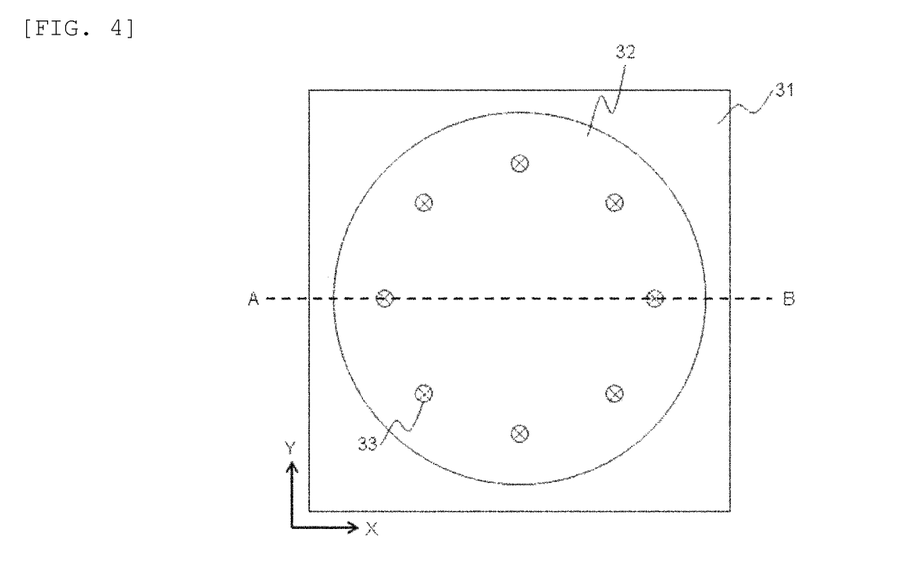
FIG. 4 is a diagram illustrating an example of a method of attaching an electrostatic chuck to a sample stage according to the first embodiment.

FIG. 4 is a diagram illustrating an example of a method of attaching the electrostatic chuck 32 to the sample stage 31 according to the first embodiment. FIG. 4 shows a method of attaching the electrostatic chuck 32 to the sample stage 31 when viewed from the objective lens 11.

The electrostatic chuck 32 is attached to the sample stage 31 by using a screw 33, such that the electrostatic chuck 32 does not come off by the movement of the sample stage 31. In FIG. 4, the electrostatic chuck 32 is attached to the sample stage 31, such that a screw thread is located on the side of the electrostatic chuck 32. Alternatively, the electrostatic chuck 32 may be attached, such that a screw thread is located on the side of the sample stage 31.

Generally, the material constituting the electrostatic chuck is a ceramic material, and the material constituting sample stage 31 is a metal, in order to facilitate machining thereof. When the temperature of a structure in which different materials are bonded to each other is changed, since thermal expansion coefficients of the different materials are different from each other, bonding surfaces of the different materials are distorted in the direction of the normal line due to the difference of an expansion amount or a contraction amount in the direction parallel to the bonding surfaces. This distortion is an action for reducing the stress of the bonding surfaces.

Figure 5:
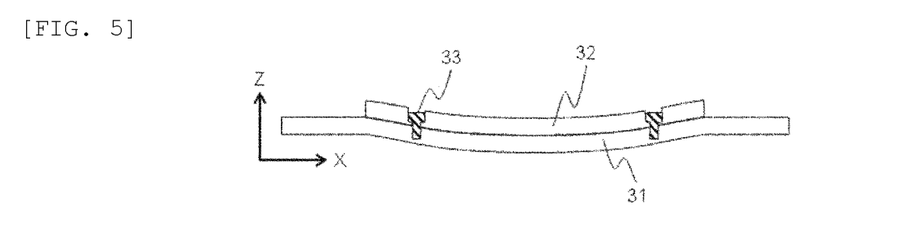
FIG. 5 is a diagram illustrating an example of a distortion caused by temperature changes of the electrostatic chuck and the sample stage of the first embodiment.

FIG. 5 is a diagram illustrating an example of a distortion caused by temperature changes of the electrostatic chuck 32 and the sample stage 31 of the first embodiment. FIG. 5 shows an A-B cross-section, which is the cross-section of electrostatic chuck 32 and the sample stage 31 cut along a dashed line 34 viewed from the Z-X plane.

Generally, a thermal expansion coefficient of a ceramic material is less than half a thermal expansion coefficient of a metal. Therefore, when the temperatures of the electrostatic chuck 32 and sample stage 31 increases, a distortion occurs on the side of the electrostatic chuck 32. On the other hand, when the temperature drops, a distortion occurs on the opposite side. As shown in FIG. 5, an amount of change in the shape of the electrostatic chuck 32 depends on the position of the electrostatic chuck 32 (a distance from the center of the electrostatic chuck 32).

Figure 6:
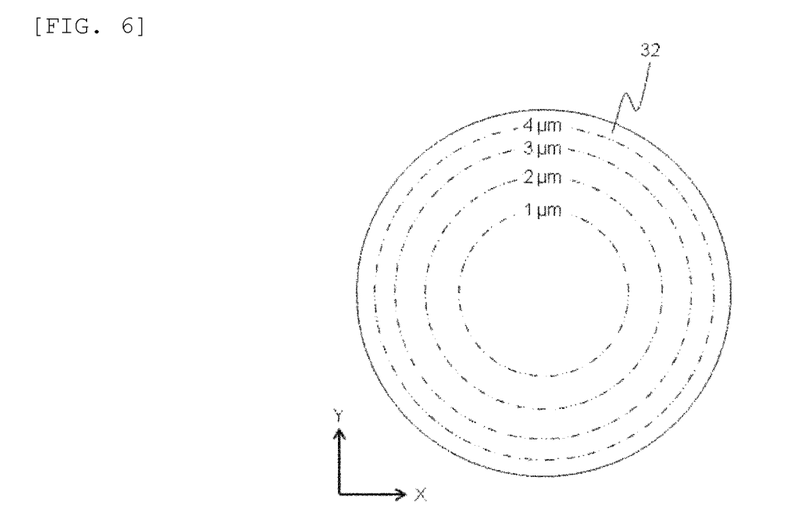
FIG. 6 is a diagram illustrating an example of a change in the height associated with a change of the temperature of the electrostatic chuck of the first embodiment.

FIG. 6 is a diagram illustrating an example of a change in the height associated with a change of the temperature of the electrostatic chuck 32 of the first embodiment.

As shown in FIG. 4, when the electrostatic chuck 32 is attached to the sample stage 31 so as to become an object eight times, the strength of the attachment of the electrostatic chuck 32 to the sample stage 31 can be considered to be uniform. Therefore, a distortion in the Z direction due to a temperature change occurs concentrically around the center of the electrostatic chuck 32.

The magnitude of the distortion is proportional to a temperature change. Therefore, by integrating amounts of changes in distortion corresponding to the amounts of changes in the temperature to the distribution of the distortion, which is a reference, the amount of change in height associated with a predetermined temperature change can be calculated.

In the present embodiment, map data showing the distribution of distortions as shown in FIG. 6 is stored in the storage device 62 as parameter information 81. Also, a function indicating the distribution of distortions may be stored in the storage device 62 as the parameter information 81. In this function, the variation in temperature and the position of the electrostatic chuck 32 are used as variables. The map data and the function may be defined based on measured values or may be defined based on results of simulations.

Also, the parameter information 81 may be set by a user or the like by using the input/output device 63. Alternatively, the parameter information 81 regarding a plurality of patterns may be stored in the storage device 62 in advance and a user may select the parameter information 81 to use.

In case of retaining a function indicating the distribution of distortions as the parameter information 81, the correction value calculation module 72 calculates a correction value (the data 205) by inputting the stage coordinate (the data 201) and a difference between the reference temperature of the electrostatic chuck 32 (the data 203) and the current temperature of the electrostatic chuck (the data 202) to the function.

Although the example in which the electrostatic chuck 32 is fixed to the sample stage 31 by using the screw 33 is shown, the present embodiment is not limited thereto.

As described above, according to the first embodiment, the charged particle beam device can calculate the height of the sample 2 in consideration of a distortion of the electrostatic chuck 32 or the like associated with a temperature change. As a result, the accuracy of a focus is improved, and a period of time for setting the focus is shortened. Therefore, the measurement of the sample 2 with high accuracy and high speed can be implemented. In other words, a charged particle beam device with both sufficient throughput and sufficient measurement accuracy can be implemented.

Second Embodiment

In the second embodiment, a method of attaching an electrostatic chuck 32 to a sample stage 31 is different from that of the first embodiment. Hereinafter, the second embodiment will be described by focusing on the difference from the first embodiment.

The configuration of a charged particle beam device of the second embodiment is the same as that of the first embodiment. The hardware configurations of an electron optical system lens barrel 91, a power supply unit 92, and a control unit 93 of the second embodiment are the same as those of the first embodiment. The software configuration of a control unit 93 of the second embodiment is the same as that of the first embodiment. Also, a process executed by a control module 70 of the second embodiment is the same as that of the first embodiment.

Figure 7:
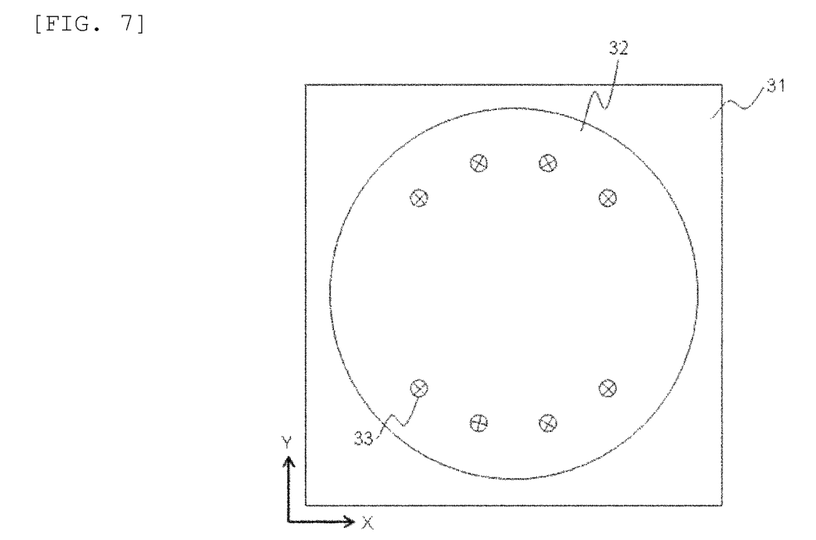
FIG. 7 is a diagram illustrating an example of a method of attaching an electrostatic chuck to a sample stage according to a second embodiment.
Figure 8:
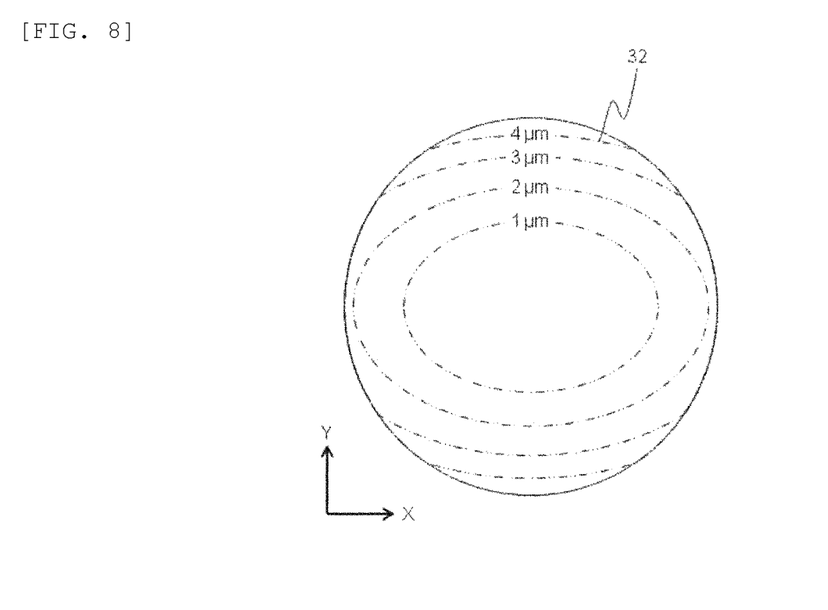
FIG. 8 is a diagram illustrating an example of a change in the height associated with a change of the temperature of the electrostatic chuck of the second embodiment.

FIG. 7 is a diagram illustrating an example of a method of attaching the electrostatic chuck 32 to the sample stage 31 according to the second embodiment. FIG. 8 is a diagram illustrating an example of a change in the height associated with a change of the temperature of the electrostatic chuck 32 of the second embodiment.

FIG. 7 shows a method of attaching the electrostatic chuck 32 to the sample stage 31 when viewed from the objective lens 11. As shown in FIG. 7, the electrostatic chuck 32 is attached to the sample stage 31 so as to become an object twice. In this case, the strength of the attachment is not uniform, and the strength of the attachment varies depending on positions.

Distribution of distortions in the Z direction in the attachment method as shown in FIG. 7 is as shown in FIG. 8. That is, a distortion in the Z direction at a position where the attachment is strong is significant, whereas a distortion in the Z direction at a position where the attachment is weak is small.

The charged particle beam device can obtain the same effect as that of the first embodiment by retaining the parameter information 81, such as map data or a function, corresponding to a method of attaching the electrostatic chuck 32.

Third Embodiment

In the third embodiment, the mounting position of a temperature sensor 42 is different from that in the first embodiment. Hereinafter, the third embodiment will be described by focusing on the difference from the first embodiment.

The configuration of a charged particle beam device of the third embodiment is the same as that of the first embodiment.

Figure 9:
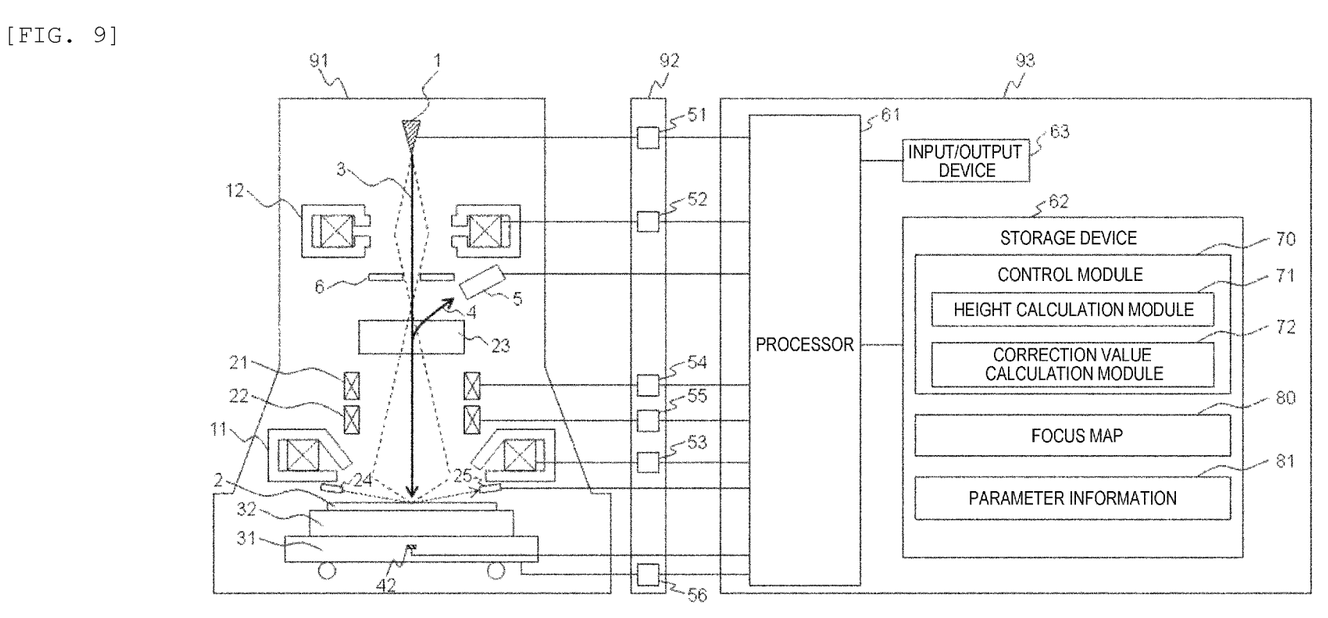
FIG. 9 is a diagram showing a configuration example of a charged particle beam device according to a third embodiment.

FIG. 9 is a diagram showing a configuration example of the charged particle beam device according to the third embodiment.

In an electron optical system lens barrel 91 of the third embodiment, the temperature sensor 42 is mounted on a sample stage 31. The rest of the configuration is the same as that of the first embodiment. Also, the hardware configurations of a power supply unit 92 and a control unit 93 of the third embodiment are the same as those of the first embodiment.

The software configuration of the control unit 93 of the third embodiment is the same as that of the first embodiment. Also, a process executed by a control module 70 of the third embodiment is the same as that of the first embodiment.

The third embodiment has the same effect as that of the first embodiment.

Fourth Embodiment

In the fourth embodiment, a height calculation process based on the focus map 80 is different from that of the first embodiment. Hereinafter, the fourth embodiment will be described by focusing on the difference from the first embodiment.

The configuration of a charged particle beam device of the fourth embodiment is the same as that of the first embodiment. The hardware configurations of an electron optical system lens barrel 91, a power supply unit 92, and a control unit 93 of the fourth embodiment are the same as those of the first embodiment. The software configuration of the control unit 93 of the fourth embodiment is the same as that of the first embodiment.

Figure 10:
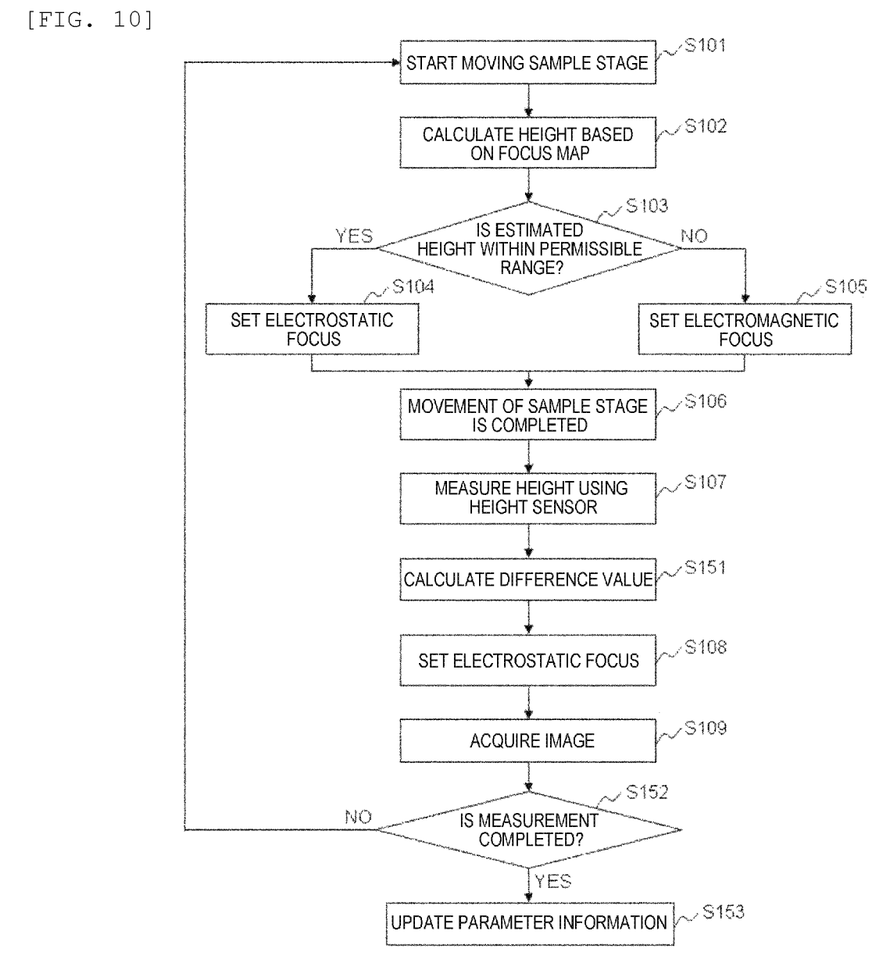
FIG. 10 is a flowchart illustrating an image acquisition process executed by a control unit according to a fourth embodiment by controlling an electron optical system lens barrel.

FIG. 10 is a flowchart illustrating an image acquisition process executed by the control unit 93 according to the fourth embodiment by controlling the electron optical system lens barrel 91.

After the processes from step S101 to step S107 are executed, the control module 70 executes a difference value calculation process (step S151).

Specifically, the control module 70 calculates a difference between a height estimation value and the height measured in step S107. The control module 70 temporarily stores update data including the stage coordinates of a destination, a temperature measured by a temperature sensor 42, and the difference value in a storage device 62.

After the process of step S151, the control module 70 executes processes of steps S108 and S109. Thereafter, the control module 70 determines whether measurements are completed for all measurement points (step S152).

If it is determined that measurements are not completed for all measurement points, the control module 70 returns to step S101 and executes the same process for a next measurement point.

If it is determined that measurements are completed for all measurement points, the control module 70 executes a parameter information updating process (step S153). In the parameter information updating process, the parameter information 81 used by the correction value calculation module 72 is updated. For example, when map data is stored as the parameter information 81, the following process is executed.

The control module 70 reads the map data (the parameter information 81) and the update data from the storage device 62 and updates the map data by using the position and the temperature, such that errors of respective measurement points are minimized. For example, a method of updating map data by using the least squares method or the like can be employed. Also, the present embodiment is not limited to a method of updating map data.

The same process is executed when a function is stored as the parameter information 81.

The fourth embodiment has the same effect as that of the first embodiment. Furthermore, according to the fourth embodiment, the estimation accuracy can be improved by reflecting an actual distortion of the electrostatic chuck 32 associated with a temperature change to the parameter information 81 (map data or a function) used by the correction value calculation module 72.

Fifth Embodiment

The fifth embodiment is different from the first embodiment in that a height estimation value is corrected based on a change in the atmospheric pressure. Hereinafter, the fifth embodiment will be described by focusing on the difference from the first embodiment.

Figure 11:
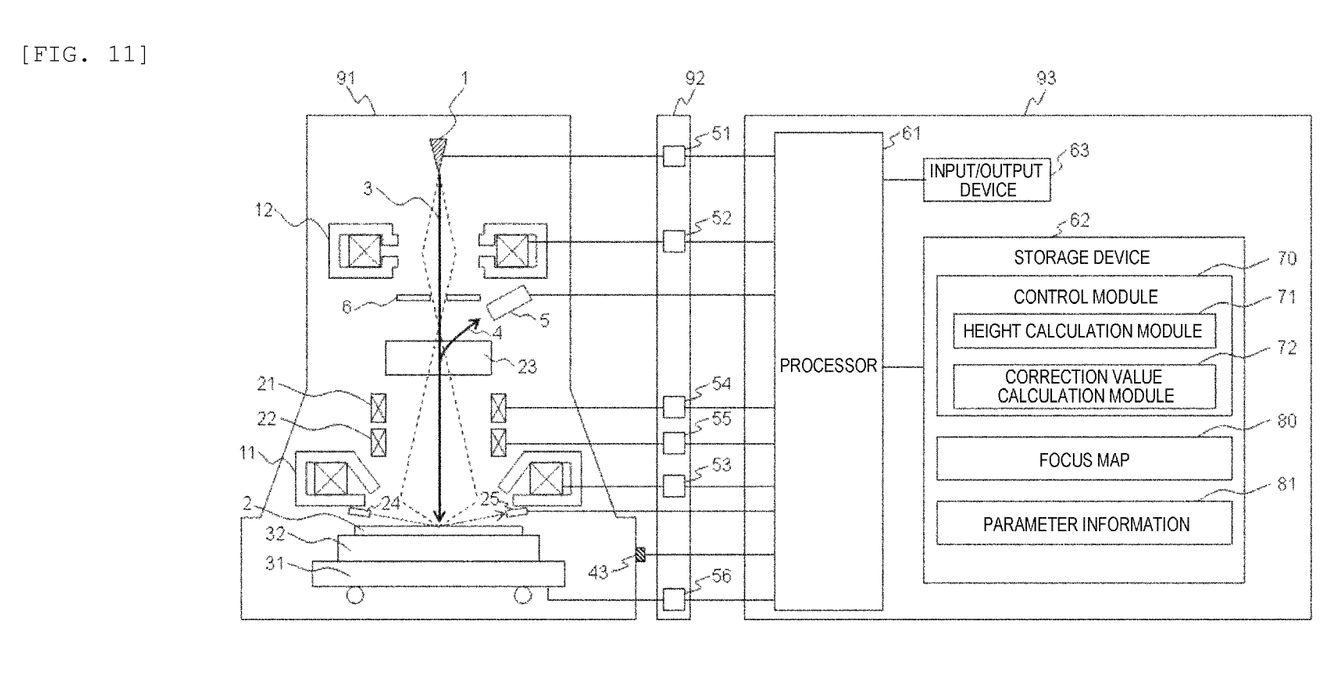
FIG. 11 is a diagram showing a configuration example of a charged particle beam device according to a fifth embodiment.

FIG. 11 is a diagram showing a configuration example of a charged particle beam device according to the fifth embodiment.

In the fifth embodiment, an atmospheric pressure sensor 43 is mounted on an electron optical system lens barrel 91 instead of a temperature sensor 42. In FIG. 11, the atmospheric pressure sensor 43 is installed outside the electron optical system lens barrel 91, but the present embodiment is not limited to the installation location of the atmospheric pressure sensor 43. The rest of the configuration is the same as that of the first embodiment.

Also, the hardware configurations of a power supply unit 92 and a control unit 93 of the fifth embodiment are the same as those of the first embodiment.

The software configuration of the control unit 93 of the fifth embodiment is the same as that of the control unit 93 of the first embodiment. Also, a process executed by a control module 70 of the fifth embodiment is the same as the process executed by the control module 70 of the first embodiment.

The pressure inside the electron optical system lens barrel 91 is controlled to be lower than the atmospheric pressure. When the atmospheric pressure changes, an external force applied to the electron optical system lens barrel 91 changes, and thus the shape of the electron optical system lens barrel 91 changes. As a result, an error occurs between a height measured by a height sensor 25 and a focus value. That is, the relationship between the height measured by the height sensor 25 and the focus value (height estimation value) depends on the atmospheric pressure.

In the present embodiment, a correction value calculation module 72 corrects the relationship between a value measured by the height sensor 25 and a focus value of a primary electron beam in accordance with a change in the atmospheric pressure.

Figure 12:
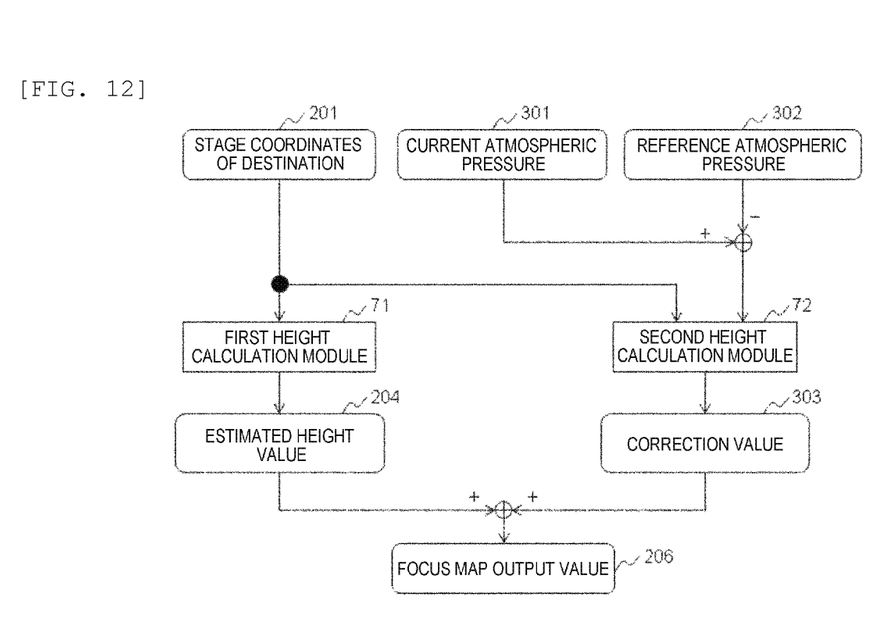
FIG. 12 is a diagram for describing details of a height calculation process based on a focus map according to the fifth embodiment.

FIG. 12 is a diagram for describing details of a height calculation process based on a focus map 80 according to the fifth embodiment.

The control module 70 acquires data 201 indicating stage coordinates of a destination (measurement position of a sample 2) and inputs the data 201 to a height calculation module 71 and the correction value calculation module 72.

Furthermore, the control module 70 acquires data 301 representing a reference atmospheric pressure and data 302 representing a current atmospheric pressure and calculates a difference between the two atmospheric pressures. The control module 70 inputs the difference into the correction value calculation module 72.

The reference atmospheric pressure is a value sensed by the atmospheric pressure sensor 43 when a scanning electron microscope is adjusted or when the sample 2 is placed on the sample stage 31 and is stored in a storage device 62 in advance. The current atmospheric pressure is a current atmospheric pressure measured by using the atmospheric pressure sensor 43. Also, the data 301 and the data 302 are data representing the distribution of amounts of changes in the height associated with changes in the atmospheric pressure. In the present embodiment, it is assumed that the control module 70 acquires the data 301 when moving the sample stage 31.

Also, the control module 70 may use the atmospheric pressure when the sample 2 is installed to the electrostatic chuck 32 as the data 301. Therefore, a period of time for acquiring the data 301 can be reduced.

A process executed by the height calculation module 71 is the same as that in the first embodiment.

When the data 201 and a difference between the data 301 and the data 302 are input, the correction value calculation module 72 calculates data 303 representing a correction value associated with a change in the atmospheric pressure based on the data 201 and the difference.

As in the first embodiment, the correction value calculation module 72 retains map data or a function indicating a distribution of distortions of the electron optical system lens barrel 91 associated with atmospheric pressure change parameter information 81. By reflecting a distortion of the electron optical system lens barrel 91 onto a distortion of the electrostatic chuck 32, a result of the reflection can be used as the parameter information 81 as in the first embodiment.

The control module 70 adds the correction value (the data 303) to the height estimation value (the data 204) and outputs a result thereof as a focus map output value 206.

According to the fifth embodiment, the charged particle beam device can calculate the height of the sample 2 in consideration of a distortion of the electron optical system lens barrel 91 associated with a change in the atmospheric pressure. As a result, measurement of the sample 2 with high accuracy and high speed can be implemented. In other words, a charged particle beam device with both sufficient throughput and sufficient measurement accuracy can be implemented.

Furthermore, the present invention is not limited to the embodiments described above, and various modifications can be made therein. For example, the above-described embodiments have been described in detail in order to explain the present invention in an easy-to-understand manner, and are not necessarily limited to those having all the configurations described. Furthermore, the configurations of other embodiments can be added to, deleted from, and replace a part of the configuration of each embodiment.

For example, each of the above-described configurations, functions, processing units, processing means, and the like can be realized by hardware, for example, by designing some or all of them as an integrated circuit or the like. Also, the present invention can be realized by a program code of software which realizes the functions of the embodiments. In this case, a storage medium storing the program code is provided to a computer, and a CPU included in the computer reads out the program code stored in the storage medium. In this case, the program code itself read from the storage medium realizes the functions of the above-described embodiments, and the program code itself and the storage medium storing the program code constitute the present invention. Examples of the storage medium for supplying such a program code include a flexible disk, a CD-ROM, a DVD-ROM, a hard disk, a solid state drive (SSD), an optical disk, a magneto-optical disk, a CD-R, a magnetic tape, a nonvolatile memory card, a ROM, or the like.

In addition, the program code for realizing the functions described in the embodiments can be implemented with a wide range of programming languages or script languages, such as Assembler, C/C++, Perl, Shell, PHP, Java, and the like.

Furthermore, by transmitting program codes of software realizing the functions of the embodiments via a network, the program codes may be stored in a storage units, such as a hard disk of a computer, a memory, or the like, or a storage medium, such as a CD-RW, a CD-R, or the like, such that a CPU of a computer may read and execute the program codes stored in the storage units or the storage medium.

In the above embodiments, control lines and information lines indicate those considered as necessary for explanation, and not necessarily all of the control lines and the information lines are always shown on a product. All of the components may be connected to one another.

The invention claimed is:

1. A measuring device for measuring a sample by emitting a charged particle beam, the measuring device comprising:
    a particle source configured to emit the charged particle beam;
    an electronic lens configured to focus the charged particle beam;
    a detector configured to detect a signal generated from the sample irradiated with the charged particle beam;
    a stage capable of moving with the sample mounted thereon;
    an electrostatic chuck attached to the stage that fixes the sample, the stage and the electrostatic chuck being made of different materials;
    a sensor configured to measure environment of the measuring device; and
    a control device configured to control the measuring device overall, the control device comprising a processor that executes:
        a height calculation process configured to calculate a height estimation value indicating an estimated height of the sample at a measurement position; and
        a correction value calculation process configured to calculate a correction value reflecting a change of the environment based on the measurement position of the sample and an amount of change of the environment measured by the sensor;
        a height correction process to correct the height estimation value based on the correction value; and
        a setting process to set a control value for controlling focus adjustment using the electronic lens based on the corrected height estimation value, wherein
    the control device retains parameter information representing a distribution of distortions caused by a stress of a connecting portion of the stage and the electrostatic chuck due to a difference in materials thereof for calculating the correction value, and
    the correction value calculation process calculates the correction value of the measurement position of the sample based on the measurement position of the sample, the amount of environmental change measured by the sensor, and the parameter information.

2. The measuring device according to claim 1, wherein the control device retains a focus map indicating a relationship between a position of the sample in a plane and a height of the sample,
    the height calculation process calculates the height estimation value based on the measurement position of the sample and the focus map.

3. The measuring device according to claim 2, wherein the environment is at least one of a temperature and an atmospheric pressure.

4. The measuring device according to claim 3, further comprising:
    a height sensor configured to measure an actual measured value indicating the height of the sample at the measurement position, wherein
    the processor executes a process to:
        calculate an error between the corrected height estimation value and the actual measured value after the control value is set based on the corrected height estimation value;
        set a new control value based on the actual measured value; and
        update the parameter information based on the error.

5. The measuring device according to claim 4, wherein
the electronic lens includes an electromagnetic lens for changing a focusing action of the charged particle beam by using the action of a magnetic field lens and an electrostatic lens for changing the focusing action of a charged particle beam by using the action of an electric field, and the processor executes a process to:
  determine whether the corrected height estimation value is greater than a threshold value;
  set a control value for controlling a focus adjustment using the electrostatic lens based on the corrected height estimation value when it is determined that the corrected height estimation value is equal to or less than the threshold value;
  set a control value for controlling a focus adjustment using the electromagnetic lens based on the corrected height estimation value when it is determined that the corrected height estimation value is greater than the threshold value; and
  set a control value for controlling focus adjustment using the electrostatic lens based on the actual measured value.

6. The measuring device according to claim 1, wherein the electrostatic chuck fixes the sample by adsorbing the sample.

7. A measuring method in a measuring device for measuring a sample by emitting a charged particle beam, the measuring device including a particle source configured to emit the charged particle beam; an electronic lens configured to focus the charged particle beam; a detector configured to detect a signal generated from the sample irradiated with the charged particle beam; a stage capable of moving with the sample mounted thereon; an electrostatic chuck attached to the stage that fixes the sample, the stage and the electrostatic chuck being made of different materials; a sensor configured to measure environment of the measuring device; and a control device configured to control the measuring device overall and including a control module, the measuring method comprising:
  a first step in which the control module calculates a height estimation value indicating an estimated value of the height of the sample at a measurement position;
  a second step in which the control module calculates a correction value reflecting an environmental change based on the measurement position and an amount of the environmental change measured by the sensor;
  a third step in which the control module corrects the height estimation value based on the correction value;
  a fourth step in which the control module sets a control value for controlling a focus adjustment using the electronic lens based on the corrected height estimation value; and
  a fifth step in which the control module detects the signal by irradiating the sample with the charged particle beam set to a predetermined focus value by the electronic lens to which the control value is set, wherein
the control device retains parameter information representing a distribution of distortions caused by a stress of a connecting portion of the stage and the electrostatic chuck due to a difference in materials thereof for calculating the correction value, and
in the second step, the control module calculates the correction value of the measurement position of the sample based on the measurement position of the sample, the amount of environmental change measured by the sensor, and the parameter information.

8. The measuring method according to claim 7, wherein
the control device retains a focus map indicating a relationship between a position of the sample in a plane and a height of the sample,
in the first step, the control module calculates the height estimation value based on the measurement position of the sample and the focus map.

9. The measuring method according to claim 8, wherein the environment is at least one of a temperature and an atmospheric pressure.

10. The measuring method according to claim 9, wherein
the measuring device further includes a height sensor configured to measure an actual measured value indicating the height of the sample at the measurement position, and
the measuring method further comprises:
a sixth step in which the control module sets a new control value based on the actual measured value after the process of the fourth step is executed; and
a seventh step in which the control module updates the parameter information based on an error between the corrected height estimation value and the actual measured value after the process of the fifth step is executed.

11. The measuring method according to claim 10, wherein
the electronic lens includes an electromagnetic lens for changing a focusing action of the charged particle beam by using the action of a magnetic field and an electrostatic lens for changing the focusing action of a charged particle beam by using the action of an electric field,
the fourth step includes:
a step in which the control module determines whether the corrected height estimation value is greater than a threshold value;
a step in which, when it is determined that the corrected height estimation value is equal to or less than the threshold value, the control module sets a control value for controlling a focus adjustment using the electrostatic lens based on the corrected height estimation value; and
a step in which, when it is determined that the corrected height estimation value is greater than the threshold value, the control module sets a control value for controlling a focus adjustment using the electromagnetic lens based on the corrected height estimation value, and
the sixth step includes a step in which the control module sets a control value for controlling a focus adjustment using the electrostatic lens based on the actual measured value.

12. The measuring method according to claim 7, wherein the electrostatic chuck fixes the sample by adsorbing the sample.

* * * * *